US009595977B2

(12) United States Patent
Landau et al.

(10) Patent No.: US 9,595,977 B2
(45) Date of Patent: Mar. 14, 2017

(54) LDPC DECODER WITH EFFICIENT CIRCULAR SHIFTERS

(71) Applicant: APPLE INC., Cupertino, CA (US)

(72) Inventors: Asaf Landau, Herzlia Pituach (IL); Tomer Ish-Shalom, Herzlia Pituach (IL); Yonathan Tate, Herzlia Pituach (IL)

(73) Assignee: APPLE INC., Cupertino, CA (US)

( * ) Notice: Subject to any disclaimer, the term of this patent is extended or adjusted under 35 U.S.C. 154(b) by 256 days.

(21) Appl. No.: 14/499,284

(22) Filed: Sep. 29, 2014

(65) Prior Publication Data

US 2016/0094245 A1     Mar. 31, 2016

(51) Int. Cl.
*H03M 13/11* (2006.01)
*H03M 13/27* (2006.01)
(Continued)

(52) U.S. Cl.
CPC ...... *H03M 13/116* (2013.01); *H03M 13/1111* (2013.01); *H03M 13/1137* (2013.01);
(Continued)

(58) Field of Classification Search
CPC .......... H03M 13/1165; H03M 13/1111; H03M 13/116; H03M 13/616; H03M 13/271;
(Continued)

(56) References Cited

U.S. PATENT DOCUMENTS 6,757,122 B1 * 6/2004 Kuznetsov ......... H03M 13/1131
360/46
7,539,920 B2    5/2009 Choi et al.
(Continued)

FOREIGN PATENT DOCUMENTS

| CN | 102111241 A | 6/2011 |
| CN | 103905063 A | 7/2014 |
| WO | 2014179502 A1 | 11/2014 |

OTHER PUBLICATIONS

Cui et al., "Efficient Decoder Design for High-Throughput LDPC decoding", IEEE Asia Pacific Conference on Circuits and Systems, pp. 1640-1643, Nov. 2008.

(Continued)

*Primary Examiner* — Cynthia Britt
*Assistant Examiner* — Sazzad Hossain
(74) *Attorney, Agent, or Firm* — D. Kligler IP Services Ltd.

(57) ABSTRACT

A decoder includes variable-node circuitry, check-node circuitry and a Message Passing (MP) module, which includes multiple configurable partial cyclic shifters that each supports only a partial subset of shift values out of a full range of shift values 0 . . . L−1. The variable-node circuitry and check-node circuitry are configured to exchange messages with one another in accordance with a parity check matrix that represents a respective Quasi-Cyclic (QC)-Low Density Parity Check (LDPC) Error Correcting Code (ECC) and that includes L-by-L sub-matrices, and to process the exchanged messages to decode a given code word that was encoded using the QC-LDPC ECC. The MP module is configured to schedule the variable-node circuitry and check-node circuitry that are interconnected in accordance with a respective sub-matrix to exchange L messages simultaneously by assigning a given partial cyclic shifter to shift the L messages cyclically a number of positions that depends on a structure of the respective sub-matrix.

18 Claims, 5 Drawing Sheets

(51) Int. Cl.
*H04L 1/00* (2006.01)
*H03M 13/00* (2006.01)
*H03M 13/15* (2006.01)

(52) U.S. Cl.
CPC ..... *H03M 13/1102* (2013.01); *H03M 13/1165* (2013.01); *H03M 13/15* (2013.01); *H03M 13/271* (2013.01); *H03M 13/616* (2013.01); *H03M 13/6552* (2013.01); *H03M 13/6555* (2013.01); *H04L 1/0057* (2013.01)

(58) Field of Classification Search
CPC ......... H03M 13/1102; H03M 13/6552; H03M 13/2906; H03M 13/6555; H03M 13/15; H03M 13/1137; H01L 1/0057
USPC .................................................. 714/752, 758
See application file for complete search history.

(56) References Cited

U.S. PATENT DOCUMENTS

| | | | |
|---|---|---|---|
| 7,765,453 | B2 | 7/2010 | Duggan |
| 8,291,283 | B1 | 10/2012 | Rad et al. |
| 8,291,298 | B2 | 10/2012 | Lo et al. |
| 8,359,522 | B2 | 1/2013 | Gunnam et al. |
| 8,392,789 | B2 | 3/2013 | Biscondi et al. |
| 8,392,795 | B2 | 3/2013 | Ueng et al. |
| 8,473,806 | B1 | 6/2013 | Rad et al. |
| 8,601,352 | B1 | 12/2013 | Anholt et al. |
| 8,645,810 | B2 | 2/2014 | Sharon et al. |
| 8,661,326 | B1 | 2/2014 | Li et al. |
| 8,839,077 | B2 | 9/2014 | Ueng et al. |
| 2008/0104474 | A1 | 5/2008 | Gao et al. |
| 2009/0172493 | A1 | 7/2009 | Park et al. |
| 2010/0107030 | A1* | 4/2010 | Graef ................. H03M 13/1111 714/752 |
| 2010/0153819 | A1* | 6/2010 | Ueng ................. H03M 13/1137 714/763 |
| 2011/0191650 | A1* | 8/2011 | Yokokawa ......... H03M 13/1137 714/752 |
| 2012/0079340 | A1* | 3/2012 | Gunnam ............ H03M 13/1137 714/752 |
| 2013/0031440 | A1 | 1/2013 | Sharon et al. |
| 2013/0124590 | A1* | 5/2013 | Gunnam ................. G06F 5/017 708/209 |
| 2014/0223255 | A1 | 8/2014 | Lu et al. |
| 2015/0249471 | A1 | 9/2015 | Yen et al. |

OTHER PUBLICATIONS

Hocevar, D.E., "LDPC code construction with flexible hardware implementation," IEEE International Conference on Communications, ICC '03, p. 2708-2712, May 2003.

\* cited by examiner $$\begin{bmatrix} 0 & 0 & 3 & 0 \\ 6 & x & 6 & 4 \\ x & 2 & x & 2 \end{bmatrix}$$

HS1 - SHIFT MATRIX

LDPC DECODER WITH EFFICIENT CIRCULAR SHIFTERS

TECHNICAL FIELD

The present disclosure relates generally to Error Correction Coding (ECC), and particularly to methods and systems for ECC decoding.

BACKGROUND

Some types of error correction codes, such as Low Density Parity Check (LDPC) codes, are commonly decoded using iterative decoding processes. Various decoding schemes for LDPC codes are known in the art.

For example, U.S. Pat. No. 8,473,806, whose disclosure is incorporated herein by reference, describes LDPC decoders that use reduced-complexity circular shifters that may be used to decode predefined or designed QC-LDPC codes. In addition, methods to design codes which may have particular LDPC code performance capabilities and which may operate with such decoders using reduced-complexity circular shifters are provided.

As another example, U.S. Pat. No. 8,359,522, whose disclosure is incorporated herein by reference, describes a method and a system for decoding low density parity check ("LDPC") codes. An LDPC decoder includes an R select unit, a Q message first-in first-out ("FIFO") memory, and a cyclic shifter. The R select unit provides an R message by selecting from a plurality of possible R message values. The Q message memory stores a Q message until an R message is generated by a Check Node Unit (CNU), the Q message and the R message are combined to provide a P message. The cyclic shifter shifts the P message.

SUMMARY

An embodiment that is described herein provides a decoder, including variable-node circuitry, check-node circuitry and a Message Passing (MP) module, which includes multiple configurable partial cyclic shifters that each supports only a partial subset of shift values out of a full range of shift values 0. . . L−1. The variable-node circuitry and the check-node circuitry are configured to exchange messages with one another in accordance with a parity check matrix that represents a respective Quasi-Cyclic (QC)-Low Density Parity Check (LDPC) Error Correcting Code (ECC) and that includes L-by-L sub-matrices, and to process the exchanged messages to decode a given code word that was encoded using the QC-LDPC ECC. The MP module is configured to schedule the variable-node circuitry and the check-node circuitry that are interconnected in accordance with a respective sub-matrix to exchange L messages simultaneously by assigning a given partial cyclic shifter to shift the L messages cyclically a number of positions that depends on a structure of the respective sub-matrix.

In some embodiments, the partial cyclic shifters support multiple partial subsets of shift values, each corresponding to a respective different subset of a range 0. . . L−1, the sub-matrices are arranged in block-rows and block-columns, and each sub-matrix in a given block-column includes a zero matrix or a matrix that is derived from an identity matrix by shifting the identity matrix cyclically a number of positions that belongs to a respective different partial subset. In other embodiments, each of the partial cyclic shifters includes a cascade of rotation stages that supports the full range of shift values 0. . . L−1 excluding one or more rotation stages. In yet other embodiments, the MP module is configured to schedule the check-node circuitry and the variable-node circuitry to exchange a group of one or more sets of L messages with one another simultaneously, and to assign different partial cyclic shifters to different sets of L messages in the group.

In an embodiment, the MP module further includes one or more full cyclic shifters that support the full shift range of shift values, and the MP module is configured to assign at least one full cyclic shifter to a set of L messages in the group. In another embodiment, the MP module is configured to assign the given partial cyclic shifter when sending the L messages from the check-node circuitry to the variable-node circuitry, and to assign an inverse partial cyclic shifter corresponding to the given partial cyclic shifter when sending the L messages from the variable-node circuitry to the check-node circuitry. In yet another embodiment, the MP module is configured to exchange the L messages and the variable-node circuitry and the check-node circuitry are configured to process the exchanged messages in a single clock period of the decoder.

In some embodiments, the given code word is stored in a memory device, and the variable-node circuitry is configured to initialize by receiving the given code word from the memory device. In other embodiments, the given code word is received in a communication signal, and the variable-node circuitry is configured to initialize with the given code word received in the communication signal.

There is additionally provided, in accordance with an embodiment that is described herein, a method including receiving in a decoder, which includes variable-node circuitry and check-node circuitry, a code word that was encoded in accordance with a Quasi-Cyclic (QC)-Low Density Parity Check (LDPC) Error Correcting Code (ECC) that is represented by a parity check matrix that includes L-by-L sub-matrices. The received code word is decoded by shifting cyclically L messages, which the variable-node circuitry and the check-node circuitry node exchange with one another simultaneously, a number of positions that is selected from a partial subset of shift values in a full shift range 0. . . L−1, depending on a structure of a respective sub-matrix that defines interconnections between the variable-node circuitry and the check-node circuitry, and processing the exchanged messages using the variable-node circuitry and the check-node circuitry.

There is additionally provided, in accordance with an embodiment that is described herein, a method including receiving a parity check matrix H that includes L-by-L sub-matrices, which are arranged in block-rows and block-columns, each sub-matrix in a given block-column includes either a zero matrix or a matrix that is derived from an identity matrix by shifting the identity matrix cyclically a given number of positions. Multiple partial subsets of shift values are defined each corresponding to a respective different subset of a range 0. . . L−1. The parity matrix H is converted to a converted parity check matrix Ĥ, by shifting all the nonzero sub-matrices in each given block-column cyclically a given number of positions, so that different sub-matrices in the given block-column correspond to different partial subsets.

These and other embodiments will be more fully understood from the following detailed description of the embodiments thereof, taken together with the drawings in which:

DETAILED DESCRIPTION OF EMBODIMENTS

Overview

Figure 1:
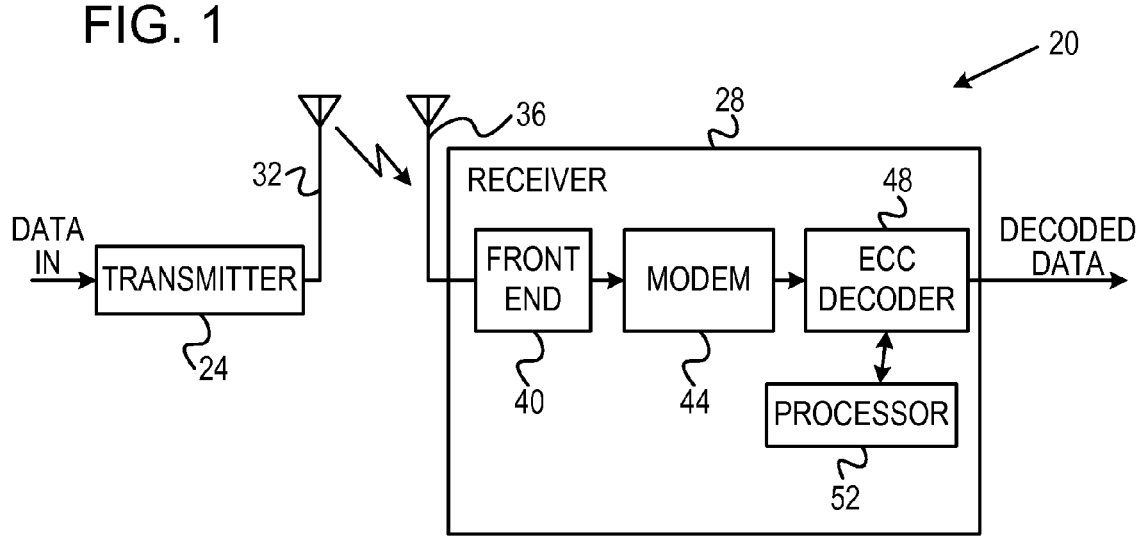
FIG. 1 is a block diagram that schematically illustrates a communication system that uses Error Correction Coding (ECC), in accordance with an embodiment that is described herein.

Some types of Error Correcting Codes (ECC), such as LDPC codes, are represented by multiple check equations that are defined over multiple variables. The ECC is sometimes represented by a parity check matrix whose rows and columns correspond to the check equations and variables, respectively, so that when a given variable appears in a given check equation the respective element in the parity check matrix is nonzero.

Some iterative ECC decoders may be additionally represented using multiple check nodes corresponding to the check equations, and multiple variable nodes corresponding to the variables. In this representation, the variable corresponding to a given variable node is connected to the check nodes that correspond to the check equations in which the variable appears. A decoder of this sort, i.e., a message passing decoder, decodes the ECC by exchanging messages between check nodes and variable nodes that are connected to one another, in an attempt to converge to a valid code word that satisfies all the check equations representing the ECC.

A Low Density Parity Check (LDPC) code is an ECC whose parity check matrix is sparse, i.e., a code in which only a small number of variables appears in each check equation. The parity check matrix of some LDPC codes, which are referred to as Quasi-Cyclic (QC)-LDPC codes, comprises multiple sub-matrices, each comprising a zero matrix or a circulant matrix, which may be derived, for example, by shifting the rows or columns of an identity matrix cyclically. Such techniques are described, for example, by Hocevar, in "LDPC code construction with flexible hardware implementation," IEEE International Conference on Communications, ICC '3, May, 2003, which is incorporated herein by reference.

Embodiments that are described herein provide improved methods and systems for decoding a QC-LDPC ECC. Assume a parity check matrix that is made-up of circulant sub-matrices of size L-by-L, each derived from the L-by-L identity matrix by shifting its rows cyclically k positions to the right ($0 \leq k \leq L-1$). Each circulant sub-matrix of the parity check matrix defines connections between L check nodes and L variable nodes, depending on the sub-matrix structure.

In some embodiments, the check and variable nodes corresponding to a given sub-matrix exchange L messages with one another, simultaneously. The L messages should be shifted cyclically k positions to the right (i.e., in accordance with the structure of the given sub-matrix) when destined to the variable nodes, and k positions to the left when destined to the check nodes.

In principle, a QC-LDPC decoder may use configurable cyclic shifters that support the full range of shift values $0 \ldots L-1$ to shift the L messages. A cyclic shifter that supports the full shift range is referred to herein as a "full cyclic shifter" or simply "full shifter" for brevity. A full shifter can be constructed, for example, by cascading D rotation stages, wherein D depends on L and on the type of the rotation stages. For example when $L=p^D$ (p and D being positive integers), the $k^{th}$ rotation stage ($k=1 \ldots D$) performs one of the p following cyclic shifts: $0, p^{k-1}, 2 \cdot p^{k-1}, \ldots, (p-1) \cdot p^{k-1}$, and the number of rotation stages is given by $D=\log_p L$.

In the disclosed techniques, the decoder uses cyclic shifters that each supports only a partial subset of the range $0 \ldots L-1$. Such a shifter is referred to herein as a "partial cyclic shifter" or simply "partial shifter" for brevity. Partial shifters are typically advantageous over full shifters in terms of area, power consumption and latency. A partial shifter can be constructed, for example, by excluding one or more rotation stages of a full shifter.

In some embodiments, the decoder comprises multiple different partial shifters, each supporting shift values in a different subset of the range $0 \ldots L-1$. To exchange L messages to be shifted k positions, the decoder assigns one of the partial shifters that support this shift value.

In some embodiments, the decoder exchanges a group of messages comprising multiple sets of L messages simultaneously, for example when processing a group (e.g., a column) of sub-matrices of the parity check matrix in parallel. In an embodiment, the decoder assigns a different partial shifter to each set of L messages. In such an embodiment, the decoder can complete a message-passing iteration over an entire column of sub-matrices in a single clock cycle.

In other embodiments, the number of sets of L messages in the group is larger than the number of available different partial shifters. For example, a column that the decoder processes in parallel may comprise more non-zero sub-matrices than the number of available different partial shifters. In one embodiment, the decoder selects a subgroup of the sets of L messages, and assigns each of the partial shifters to shift a respective set of L messages. The decoder assigns full shifters to each of the remaining sets of L messages in the group. In another embodiment, the decoder comprises multiple instances of the partial shifters and assigns to the remaining sets of L messages other instances of the partial shifters.

LDPC codes, in general, satisfy a property by which permuting the order of the columns in the parity check matrix of a given LDPC code does not change the error correction capability of the code. Thus, if for a given LDPC code the number of nonzero sub-matrices in each block column of the respective parity check matrix H does not exceed D (D is the number of rotation stages in the full shifter), the columns of H can be reordered without changing the error correction capability of the code. This property is utilized herein to implement a decoder that requires only partial shifters, as will be described below.

Applying this property of LDPC codes to QC-LDPC codes, the parity check matrix H associated with a given QC-LDPC ECC can be transformed into another parity check matrix H' by cyclically shifting the columns of its (non-zero) sub-matrices, so that H' represents a QC-LDPC code that has the same error correcting capabilities as the given QC-LDPC ECC. In an embodiment, an offline code design procedure converts H to H' so that each of the nonzero circulant sub-matrices in each column of H' correspond to a shift value that belongs to a respective different partial subset of shift values, and therefore relates to a respective different partial shifter in the decoder.

In the disclosed techniques, a decoder comprises multiple partial shifters, which are assigned to shift respective sets of L messages in a group of sets of L messages, simultaneously. By using partial shifters instead of full shifters, the decoder can be implemented with reduced area, power consumption and latency. Moreover, assigning only partial shifters to the entire group of L messages enables the decoder to operate at higher clock rates.

System Description

FIG. 1 is a block diagram that schematically illustrates a wireless communication system 20 that uses error correction coding, in accordance with an embodiment that is described herein. System 20 comprises a transmitter 24, which transmits data to a receiver 28. The transmitter accepts input data, encodes the data with a certain ECC (the encoded data is also referred to as a code word), modulates the encoded data in accordance with a certain modulation scheme, converts the modulated digital signal to an analog signal, up-converts the analog signal to a suitable Radio frequency (RF), and transmits the RF signal toward the receiver using a transmitting antenna 32.

In receiver 28, a receiving antenna 36 receives the RF signal and provides it to a RF front end 40. The front end down-converts the RF signal to baseband or to a suitable Intermediate Frequency (IF), and digitizes the signal with a suitable Analog to Digital Converter (ADC—not shown in the figure). The digitized signal carrying the ECC-encoded data (i.e., the sent code word) is demodulated by a modem 44, and the ECC is decoded by an ECC decoder 48. Decoder 48 is controlled by a processor 52. The structure and functionality of decoder 48 are described in detail below. By decoding the ECC, decoder reconstructs the data that was input to transmitter 24. The reconstructed data is provided as the receiver output.

System 20 may comprise, for example, a cellular system, a satellite system, a point-to-point communication link, or any other suitable communication system that employs ECC. Although the example of FIG. 1 refers to a wireless communication system, the techniques described herein can be used with wire-line communication systems, such as cable communication systems, as well.

Figure 2:
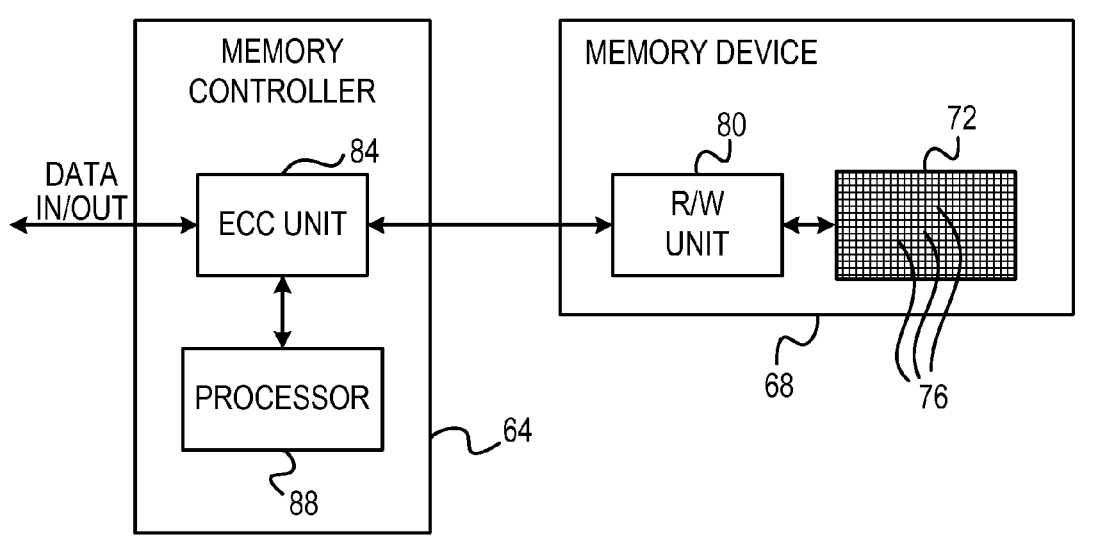
FIG. 2 is a block diagram that schematically illustrates a memory system that uses Error Correction Coding (ECC), in accordance with an embodiment that is described herein.

FIG. 2 is a block diagram that schematically illustrates a data storage system 60 that uses error correction coding, in accordance with an alternative embodiment that is described herein. System 60 comprises a memory controller 64, which stores data in a memory device 68. The memory device comprises an array 72 comprising multiple memory cells 76. Array 72 may comprise any suitable type of volatile or non-volatile memory, such as, for example, Random Access Memory (RAM) or Flash memory. Alternatively, device 68 may comprise a magnetic storage device such as a Hard Disk Drive (HDD), or any other suitable storage medium. System 60 can be used in various host systems and devices, such as in computing devices, cellular phones or other communication terminals, removable memory modules, Solid State Disks (SSD), digital cameras, music and other media players and/or any other system or device in which data is stored and retrieved.

Memory device 68 comprises a Read/Write (R/W) unit 80, which writes data values into memory cells 76 and reads data values from the memory cells. Memory controller 64 comprises an ECC unit 84, which encodes the data for storage with a certain ECC, and decodes the ECC of data that is retrieved from the memory cells. Unit 84 is controlled by a processor 88. The structure and functionality of unit 84 are described in detail below. The ECC used in systems 20 and 60 may comprise, for example, a Low Density Parity Check (LDPC) code, as well as various other types of ECC.

The ECC decoding schemes described herein can be used in communication systems such as system 20, as well as in data storage systems such as system 60. The description that follows applies to both communication applications and to storage applications, and refers generally to an ECC decoder. Any reference to the ECC decoder applies to decoder 48 of system 20, as well as to the decoder functionality of unit 84 in system 60. Alternatively, the methods described herein can be carried out by any other suitable element in any other suitable system that involves ECC decoding.

Quasi-Cyclic Error Correcting Codes

In some embodiments, ECC decoder 48 of system 20, and/or the decoding part of ECC unit 84 of system 60 comprises a Quasi-Cyclic (QC) LDPC decoder. A QC-LDPC ECC may be represented by a parity check matrix that comprises multiple sub-matrices, or sub-blocks, each comprising a zero matrix or a circulant matrix. Circulant matrices are characterized by the property that each row in the matrix is derived by shifting its preceding row cyclically one position.

In the description that follows we focus mainly on circulant sub-matrices that are based on an L-by-L identity matrix I. Thus, a nonzero sub-matrix comprises the matrix I or a version of I whose rows are cyclically shifted a number of positions between 1 and L−1.

Figures 3A, 3B:
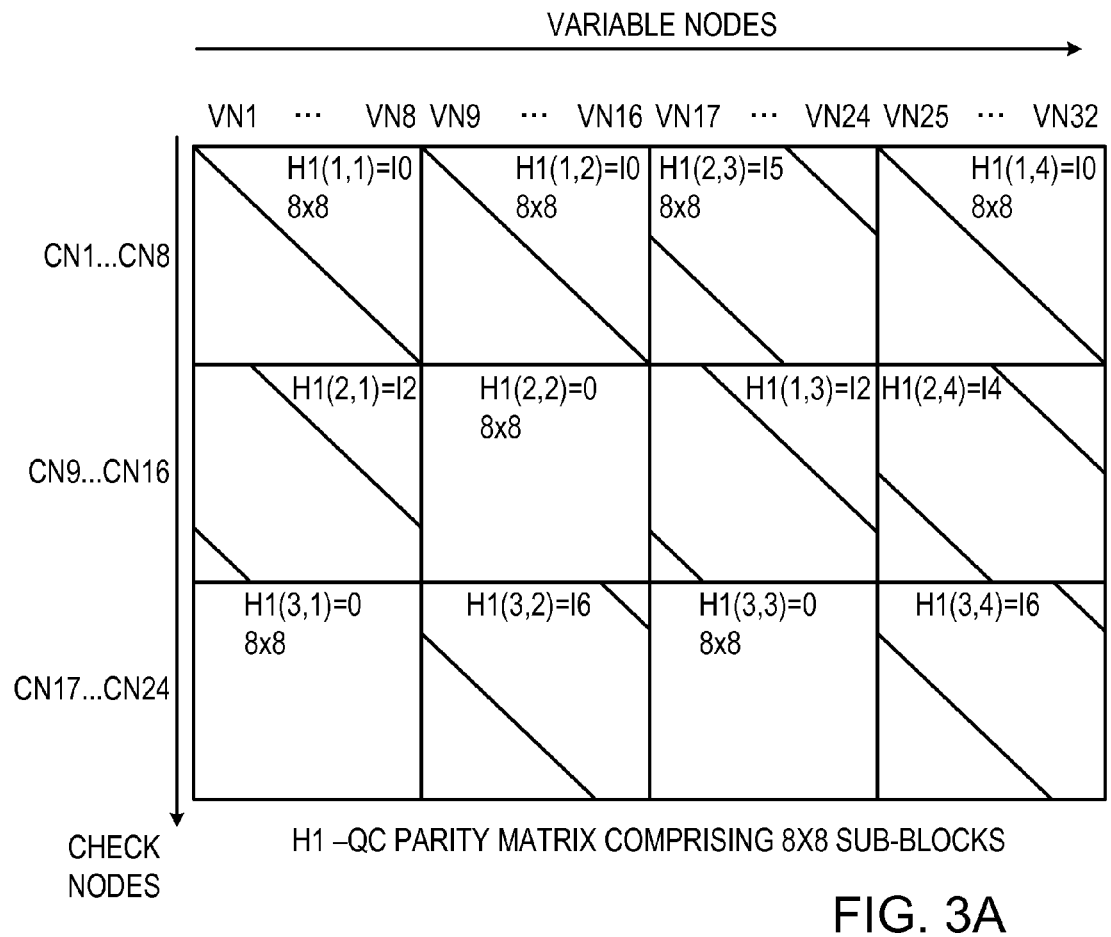
FIGS. 3A and 3B are diagrams depicting a parity check matrix comprising circulant sub-matrices, and a corresponding matrix of the respective cyclic shift values of the circulant sub-matrices, in accordance with an embodiment that is described herein.

FIGS. 3A and 3B are diagrams depicting a parity check matrix H1 of a QC-LDPC code, and a corresponding matrix HS1 that defines the cyclical shift values of the respective circulant sub-matrices, in accordance with an embodiment that is described herein. In the present example, the circulant sub-matrices of H1 are based on the 8×8 identity matrix.

H1 represents a QC-LDPC code in which twenty four check nodes CN1 . . . CN24 connect to thirty two variable nodes VN1 . . . VN32. H1 comprises twelve 8×8 sub-matrices H(i,j), $1 \leq i \leq 3$, $1 \leq j \leq 4$, that are arranged in three block-rows and four block-columns. In the figure, I0 denotes an 8×8 identity matrix, and 0(8×8) denotes an 8×8 zero matrix. Additionally, Ik denotes a circulant version of I0, whose rows are shifted k positions cyclically to the right. The values in sub-matrix Ik are zeroed except for diagonals comprising '1' values, which are depicted in the figure as respective diagonal lines. Although for L=8 k can get any value in the range 0. . . 7, in HS1 the circulant shift values are in the set {0, 2, 3, 4, 6}.

Table 1 below depicts the connections between some of the check and variable nodes in accordance with the leftmost block-column of matrix H1. As seen in Table 1, the variable nodes V1 . . . V8 are aligned with check nodes CN1 . . . CN8 as defined by the identity matrix I0. On the other hand, the same variable nodes V1 . . . VN8 are aligned with a version of check nodes CN9 . . . CN16 that is shifted cyclically two positions to the right. In addition, since H1(3,1) equals the 8×8 zero matrix, none of variable nodes VN1 . . . VN8 and check nodes CN17 . . . CN23 are interconnected. In Table 1, the symbol x denotes no connection.

TABLE 1 check nodes to variable nodes connections according to the first block-column.

|  | VN1 | VN2 | VN3 | VN4 | VN5 | VN6 | VN7 | VN8 |
|---|---|---|---|---|---|---|---|---|
| H1(1, 1) | CN1 | CN2 | CN3 | CN4 | CN5 | CN6 | CN7 | CN8 |
| H1(2, 1) | CN15 | CN16 | CN9 | CN10 | CN11 | CN12 | CN13 | CN14 |
| H1(3, 1) | x | x | x | x | x | x | x | x |

HS1 matrix in FIG. 3B is a matrix of the circulant shift values corresponding to the sub-matrices of H1 in FIG. 3A above. In FIG. 3B, an entry denoted 'x', corresponds to an 8×8 zero sub-matrix. In addition, a value 8−k in HS1 corresponds to a respective sub-matrix Ik in H1. Alternatively, Ik in H can be represented by a value k in HS1.

As will be described below, when exchanging L messages between check and variable nodes, the messages should be re-ordered in accordance with the structure of the respective sub-matrix. For example, in accordance with H1(2,1), 8 messages originated from CN9 . . . CN16 and destined to V1 . . . V8 should be shifted two positions to the right.

QC-LDPC Decoder Structure

Figure 4:
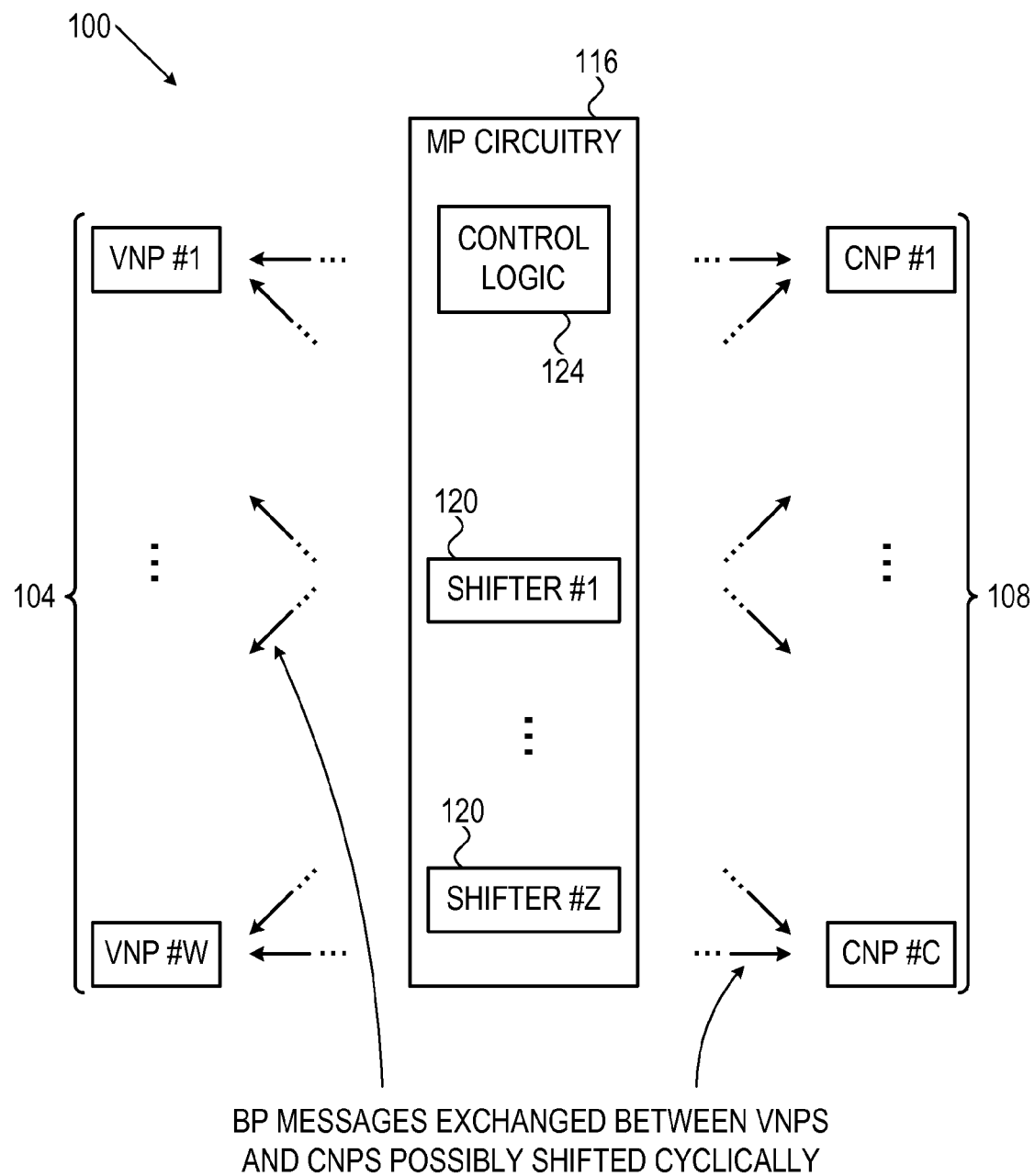
FIG. 4 is a block diagram that schematically illustrates a QC-LDPC decoder, in accordance with an embodiment that is described herein.

FIG. 4 is a block diagram that schematically illustrates a QC-LDPC decoder 100, in accordance with an embodiment that is described herein. Decoder 100 can be used to implement decoder 48 of FIG. 1 above, or ECC unit of FIG. 2 above. Decoder 100 accepts as input valid ECC code words, or other input that comprises corrupted code words (e.g., by noise) and therefore contain errors. In other words, the input to the decoder may not always comprise valid code words of the ECC. In the description that follows, the input to the decoder is also referred to as the channel output. The ECC decoder decodes the input while attempting to correct these errors, so as to reconstruct the data conveyed in the code words. In a typical implementation, each code word comprises on the order of several hundred to several thousand bits, although any other suitable code word size can be used.

The QC-LDPC ECC in question is defined by a set of M check equations, which are defined over a set of V variables (e.g., bits for a binary LDPC code). As described above, the ECC is equivalently represented by an M×V parity check matrix whose rows and columns correspond to the check equations and variables, respectively. Decoder 100 comprises a set of W Variable Node Processors (VNPs) 104 denoted VNP#1 . . . VNP#W, and a set of C Check Node Processors (CNPs) 108 denoted CNP#1 . . . CNP#C. Each variable node may be associated with a respective VNP, and each check equation may be associated with a respective CNP.

VNPs 104 and CNPs 108 are connected via a Message-Passing (MP) circuitry unit 116 and communicate with one another over arcs (shown as arrows in the figure) in accordance with the structure of the code. The VNP assigned to each variable (or variable node) is connected to the CNPs that are assigned to the check equations (or check node) in which that variable appears. As long as the decoder has not yet converged to a valid code word, at least one check equation is still unsatisfied, and the decoding process typically continues.

The description that follows refers mainly to binary LDPC codes, in which case the variable nodes are also referred to as bit nodes. The disclosed techniques, however, are similarly applicable to non-binary codes, as well.

In some embodiments, decoder 100 carries out an iterative Message-Passing (MP) decoding scheme. In an example MP scheme, VNPs 104 are initialized with the respective bit values of the channel output. The VNPs and CNPs exchange messages with one another over the arcs that connect them. Based on the messages received from the CNPs and on the channel output, VNPs may adapt their bit values. This scheme is sometimes referred to as Belief Propagation (BP), and the messages exchanged between the VNPs and CNPs are sometimes referred to as BP messages. The messages from the CNPs to the VNPs are referred to herein as CNP messages, and the messages from the VNPs to the CNPs are referred to herein as VNP messages.

In the disclosed embodiments, decoder 100 comprises a QC-LDPC decoder, which is configured to decode a respective QC-LDPC ECC, whose parity check matrix comprises L-by-L circulant sub-matrices.

In some embodiments, decoder 100 processes L check and/or variable nodes in parallel, and delivers L CNP or VNP messages simultaneously. In the description that follows and in the claims the term "simultaneous" refers to operations that occur during a single clock period.

Decoder 100 comprises one or more cyclic shifters 120. Shifter 120 accepts L CNP or VNP messages, and outputs these L messages ordered in a circular shift order relative to the order of the L messages at the input. Shifter 120 can be configured to shift between zero and L−1 positions, cyclically. Alternatively, shifter 120 supports only a partial subset of the range 0 . . . L−1. Example implementations of shifter 120 are described in FIGS. 5A-5D below. In some embodiments, shifter 120 supports cyclic shift operations in both right and left directions, and/or non-cyclic shifting.

Decoder 100 further comprises control logic 124 that manages and coordinates the operations carried out by the various elements of decoder 100. For example, control logic 124 schedules the operation of VNPs 104 and CNPs 108. Control logic 124 additionally assigns shifters 120 to shift respective sets of L messages in accordance with some scheduling scheme and the structure of the respective sub-matrices.

In some embodiments, control logic 124 configures shifter 120 to an absolute shift value in accordance with the structure of a respective sub-matrix. Alternatively, logic 124 configures shifter 120 to a relative shift value based on the structure of the previous and current respective sub-matrices. Although we mainly refer to absolute shift values, the disclosed techniques also apply to relative shift values.

When a given CNP sends L CNP messages to a given VNP in accordance with the structure of a respective sub-matrix Ik, control logic 124 configures one of shifters 120 to shift the L CNP messages cyclically k positions (e.g., to the right). Similarly, when the given VNP sends L VNP messages to the given CNP, control logic 124 configures one of shifters 120 to shift the L VNP messages L-k positions to the right (or k positions to the left). A shifter that shifts the L messages back to their original order is referred to herein as an "inverse shifter". Example inverse shifters are described further below.

Consider an example in which decoder 100 decodes a QC-LDPC ECC that is represented by the parity check matrix H1 of FIG. 3A above, wherein the subsets of check nodes CN1 . . . CN8, CN9 . . . CN16 and CN17 . . . CN24 are assigned to respective check node processors CNP#1, CNP#2 and CNP#3. Further assume that the subsets of variable nodes VN1 . . . VN8, VN9 . . . VN16, VN17 . . .

VN24 and VN25 ... VN32 are denoted VNB1, VNB2, VNB3, and VNB4, respectively. In some embodiments, when processing a block column of H in parallel, decoder 100 assigns L VNPs to process the variable node part of the message passing decoder simultaneously.

When decoder 100 decodes a QC-LDPC ECC, which is represented by parity check matrix H1 of FIG. 3A above, MP 116 delivers the eight CNP messages corresponding to CN1 ... CN8 with no shift to VNB#1, VNB#2 and VNB#4, and with a five positions cyclic shift to the right when delivered to VNB#3. As another example, the messages emitted from VN25 ... VN32 undergo a zero shift when delivered to CNP#1, four positions circular shift to the left when delivered to #CNP2, and six positions circular shift to the left when delivered to CNP#3. Note that a circular shift of k positions to the right is equivalent to a circular shift of L-k positions to the left, and vice versa.

The configuration of decoder 100 shown in FIG. 4 is an example configuration that is depicted purely for the sake of conceptual clarity. In alternative embodiments, decoder 100 can be implemented using any other suitable configuration. MP circuitry 116 is also referred to herein as an MP module.

In the context of the present patent application and in the claims, VNPs 104 are collectively referred to as variable-node circuitry. Similarly, CNPs 108 are collectively referred to as check-node circuitry. Although in the description that follows we mainly assume that L messages are exchanged (via a shifter) between a given VNP and a given CNP, this assignment is not mandatory. In alternative embodiments, L messages that were shifted by a given shifter can be split to be processed by multiple VNPs and/or CNPs. Further alternatively, any suitable assignment of VNPs and CNPs to the exchanged shifted messages is also possible. Further alternatively, the variable-node circuitry and check-node circuitry can be implemented in any other suitable manner, not necessarily using VNPs and CNPs.

ECC decoder 48 of FIG. 1, ECC unit 84 of FIG. 2 and ECC decoder 100 of FIG. 4 may be implemented in software, in hardware, or using a combination of hardware and software elements. In some embodiments, decoder 48, unit 84 and/or decoder 100 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In some embodiments, decoder 48, unit 84 and/or decoder 100 (including VNPs 104, CNPs 108, and MP circuitry 116) are implemented in hardware, such as using one or more Application-Specific Integrated Circuits (ASICs), Field-Programmable gate Arrays (FPGAs) and/or discrete components. Some or all of the decoder functions may alternatively be implemented in software, or using a combination of software and hardware elements.

Using Partial Shifters in a QC-LDPC Decoder

FIGS. 5A-5D are block diagrams that schematically illustrate several shifters 200, in accordance with embodiments that are described herein. Shifters 200 can be used to implement shifter 120 of decoder 100 described above.

In FIGS. 5A-5D, the input to shifters 200 (denoted IN1) comprises eight VNP or CNP messages. Shifters 200 accept a control value in the range 0 ... 7, which is represent by three control bits CNT_LSB, CNT_CSB and CNT_MSB. Shifter 200 shifts the eight input messages cyclically a number of positions in accordance with the control value, and outputs the eight shifted messages. In the present example we assume that shifters 200 perform a cyclic shift to the right. In alternative embodiments, shifters 200 perform cyclic shifting to the left. In yet alternative embodiments, shifters 200 support both right and left cyclic shifting.

Shifters 200 comprise a cascade of two or three rotation stages. Rotation stages 204, 208 and 212 are denoted ROTATE_1, ROTATE_2 and ROTATE_4, respectively. Each rotation stage is controlled by a respective control bit CNT_LSB, CNT_CSB and CNT_MSB of the control shift value. Rotation stages 204, 208 and 212 perform no rotation when the respective control bit equals '0'. When CNT_LSB equals '1', rotation stage 204 performs a one position circular shift to its input. Similarly, when CNT_CSB equals '1' rotation stage 208 shifts its input circularly two positions, and when CNT_MSB equals '1', rotation stage 212 shifts its input circularly four positions.

In an embodiment, each of rotation stages 204, 208 and 212 comprises a two-way multiplexer that receives as inputs eight messages and a cyclically shifted version of the eight messages, and outputs one of its inputs based on the control bit.

Figure 5A:
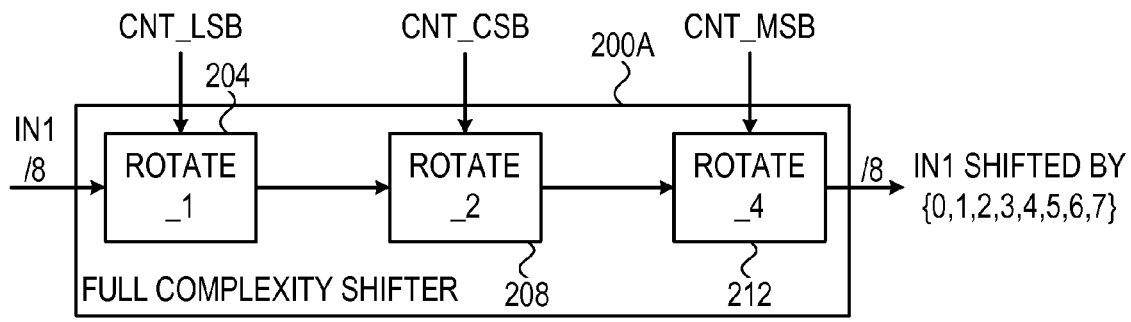
FIGS. 5A-5D are block diagrams that schematically illustrate several shifter configurations, in accordance with embodiments that are described herein.

Shifter 200A of FIG. 5A is a full shifter, which comprises a cascade of three rotation stages 204, 208 and 212, and therefore supports any shift value in the range 0 ... 7. In other embodiments, in which $L=p^D$, D and p being positive integers, shifter 200A comprises a cascade of D rotation stages, wherein the $k^{th}$ stage rotates its input up to $p^{k-1}$ positions. In yet other embodiments, L is represented as a multiplication of exponentials, i.e., $L=p1^{D1} \ldots PN^{DN}$, and shifter 200A comprises D1+ ... +DN rotation stages.

Shifters 200B, 200C and 200D are examples of partial shifters that are derived from full shifter 200A by excluding one rotation stage. Shifter 200B supports only shift values in the subset {0,2,4,6}, in which the control bit CNT_LSB equals zero, and therefore rotation stage 204 is excluded. Similarly, shifter 200C supports only shift values in the subset {0,1,4,5} for which CNT_CSB equals zero, and 200D supports only shift values in the subset {0,1,2,3} for which CNT_MSB equals zero. Therefore, rotation stages 208 in shifter 200C and 212 in shifter 200D are excluded, respectively. Excluding a rotation stage in each of the shifters saves area and power consumption, and shortens the processing latency of the shifter. In alternative embodiments, the control bit of an excluded rotation stage is set to one and the supported shift values are determined accordingly.

Figure 5B:
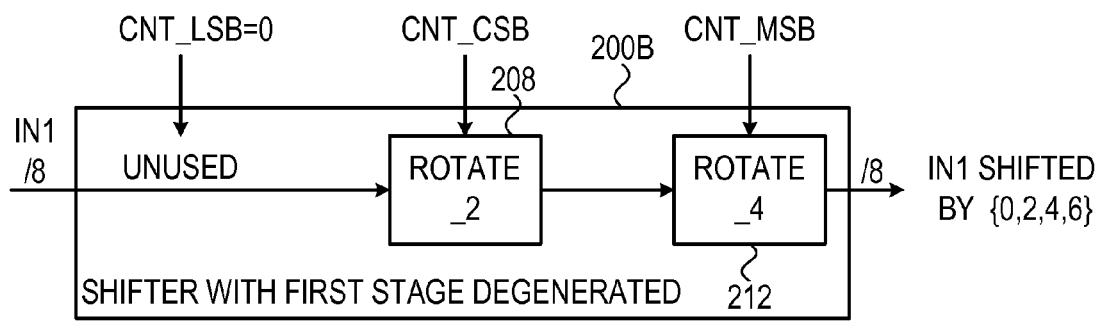

The configuration of shifters 200 in FIGS. 5A-5B are provided by way of example, and any other suitable shifter configurations can also be used. For example, although in the shifter configurations described above, typically a single rotation stage is excluded, in alternative embodiments partial shifters are constructed by excluding two or more rotation stages from a full shifter.

Decoder 100 can use partial shifters, such as, for example, shifters 200B ... 200C described above in various ways. In some embodiments, the decoder processes in parallel check and variable nodes that are related to a group of N nonzero sub-matrices. The check and variable nodes thus exchange N·L messages with one another, simultaneously. In an example embodiment, the decoder processes in parallel N nonzero sub-matrices that belong to a common block-column of the parity check matrix. In one embodiment, the decoder comprises at least N different partial shifters, and assigns a different partial shifter to each set of L messages in the group.

In other embodiments, the number on nonzero sub-matrices in the group (e.g., in a block column) is larger than N. The decoder selects a subgroup of N nonzero sub-matrices, and assigns each of the N partial shifters to a respective set of L messages. The decoder assigns full shifters to each of the remaining nonzero sub-matrices in the group. In another embodiment, the decoder comprises multiple instances of the partial shifters, and assigns to the remaining sets of L messages partial shifters of the multiple instances.

In some embodiments, the number of messages L can be represented by $L = p1^{D1} \ldots PN^{DN}$, $D = D1 + \ldots + DN$ is the number of rotation stages in the full shifter, and the number of sub-matrices per block column in H does not exceed D/T for some nonzero integer T. In such embodiments, decoder 100 can be implemented using partial shifters that comprise D-T rotation stages. This implementation relays on the property that the ECC capability of LDPC codes is unaffected by column reordering (as described above), and therefore the columns can be reordered such that for each nonzero sub-matrix in a given block column, T out of the D digits required to represent the respective shift values may be set to a constant value, e.g., '0'.

Although in the embodiments described above the decoder is typically configured to process multiple sub-matrices of a block column of H in parallel, in alternative embodiments the decoder similarly processes multiple sub-matrices of a block row of H in parallel, or in combination of block rows and block columns.

Given a number D of rotation stages of a full shifter, the parity check matrix can include groups of up to D nonzero sub-matrices ordered in given block row, block column or split between a block row and block column. The decoder assigns to each nonzero sub-matrix in such a group of sub-matrices a different partial shifter of no more than D−1 rotation stages.

Designing a QC-LDPC Code and a Respective Decoder that Uses Partial Shifters To be able to decode a QC-LDPC ECC whose parity check matrix H imposes no limitations on the structure of its circulant sub-matrices, decoder 100 should use shifters 120 that comprise full shifters. QC-LDPC codes, however, whose parity check matrix comprises circulant sub-matrices with restricted shift values, can be decoded using partial shifters and are therefore advantageous in terms of area, power consumption and processing latency.

Figure 6:
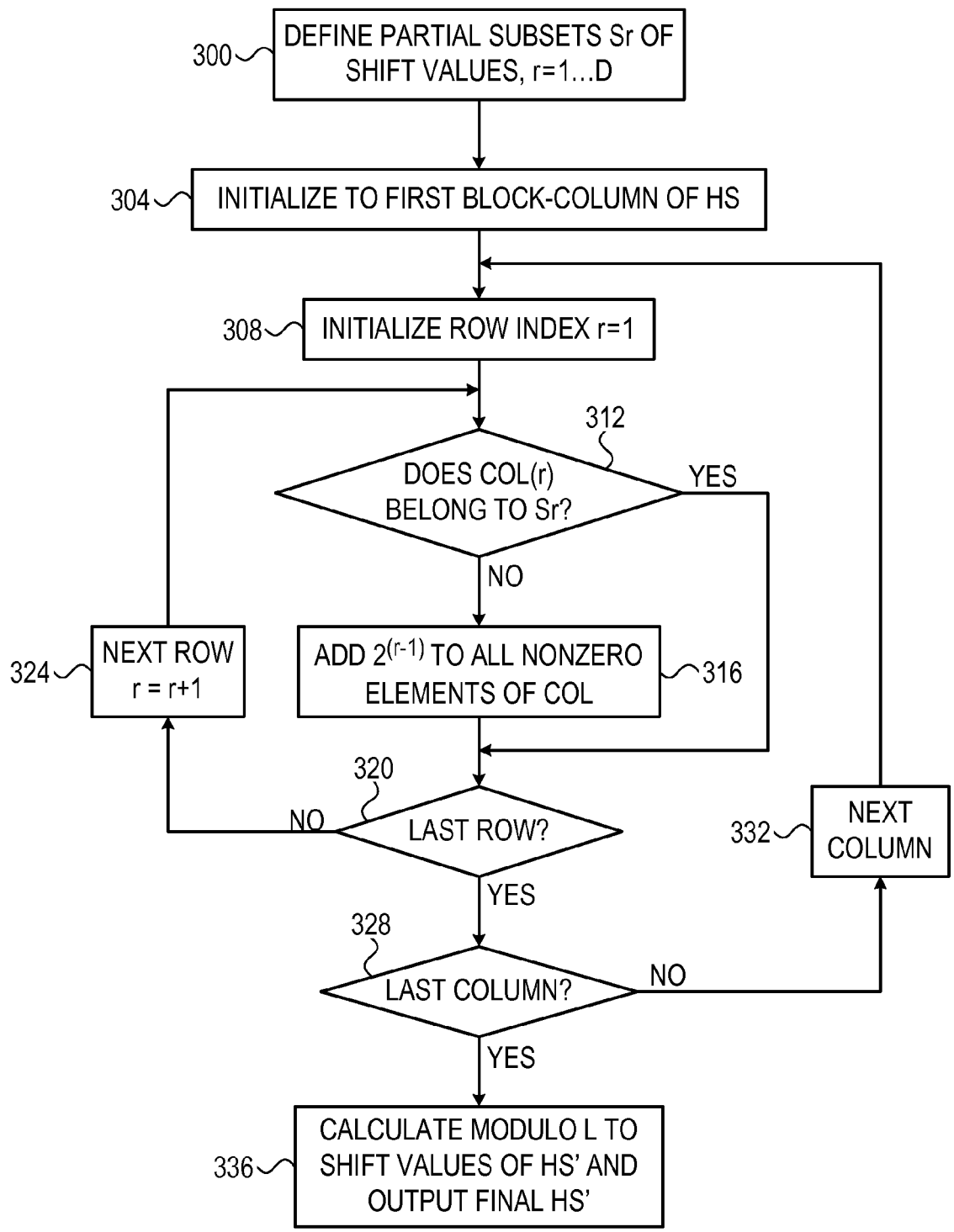
FIG. 6 is a flow chart that schematically illustrates a method for designing a QC-LDPC code, in accordance with an embodiment that is described herein.

FIG. 6 is a flow chart that schematically illustrates a method for designing a QC-LDPC code, in accordance with an embodiment that is described herein. In the resultant code, the shift value corresponding to each nonzero sub-matrix in a given block-column belongs to a different subset of shift values, and therefore assigned to a different partial shifter in the decoder. The method is typically executed by a computer as an offline procedure.

The method is based on converting a given parity check matrix H to a different matrix H' (of the same size), so that a QC-LDPC decoder for the code represented by H' can be implemented using partial shifters, and wherein the codes represented by H and H' have the same ECC capabilities. Converting H to H' is done by processing the shift matrix HS of H to convert it to another shift matrix HS' corresponding to H'.

Assume that H comprises sub-matrices of size L-by-L wherein $L = 2^D$. Additionally assume that H comprises up to D nonzero sub-matrices per block-column. The method begins at a definition step 300 by the computer defining D partial subsets of shift values, each subset comprising $2^{D-1}$ shift values in the range 0... L−1. The partial subsets are denoted Sr, wherein $1 \leq r \leq D$. In the example of FIGS. 3A and 3B above, D=3, and the subsets are given by S1={0,2,4,6}, S2={0,1,4,5} and S3={0,1,2,3}.

In an embodiment, the computer converts HS to HS' so that the shift values in each column of HS' each belong to a different respective partial subset Sr. In the present example the computer process columns of HS, and initializes to process the first (e.g., leftmost) column, at a column initialization step 304. At a row initialization step 308, the computer processes the shift value of the first row in the selected column COL(r=1).

At a shift value checking step 312, the computer checks whether COL(r) already matches one of the shift values in the partial subset Sr. For example, when r=1, the computer checks whether COL(1) belongs to the subset S1={0,2,4,6}. If the computer finds no match at step 312, the computer adds the value $2^{r-1}$ to all the nonzero elements of the current column at an addition step 316. Otherwise, the computer skips step 316. For example, the leftmost column in H1 equals [0,6,x]', and since 0 belongs to S1, the computer skips step 316. In the last example, the computer also skips step 316 when the shift value is x (no connection).

Following step 312 or 316, the computer checks whether the last row has been processed, at a row termination step 320, and if there are additional rows to process the computer increments the row index at a row selection step 324, and loops back to step 312 to process the subsequent row. Otherwise, the computer has processed all the rows in the current column and proceeds to a column termination step 328 in which the computer checks whether the last column has been processed.

If at step 328 the computer finds additional columns to be processed, the computer selects the next column at a column selection step 332 and loops back to step 308 to re-initialize the row index. Otherwise, the computer applies a modulo L operation to the shift values in HS' and outputs the final matrix HS' at an output step 336. The method then terminates.

The method of FIG. 6 can be viewed as a method in which a constant shift value is added (modulo L) to each column of HS to produce HS'. This constant can be constructed by summing the respective values added at step 316.

In the example QC-LDPC code represented by check matrix H1 and respective shift matrix HS1 of FIGS. 3A and 3B above, the method of FIG. 6 converts HS1 to HS1' as depicted in Table 2.

TABLE 2

Shift matrix HS1 converted to HS1'

| HS1 | | | | HS1' | | | |
|---|---|---|---|---|---|---|---|
| 0 | 0 | 3 | 0 | 2 | 0 | 2 | 0 |
| 6 | X | 6 | 4 | 0 | X | 5 | 4 |
| x | 2 | x | 2 | X | 2 | x | 2 |

The method described in FIG. 6 is exemplary, and other suitable methods can also be used. For example, the method can be adapted to L-by-L sub-matrices, wherein L is given by $L = p1_{D1} \ldots PN^{DN}$. As another example, the modulo L operation at step 336 above can be carried out instead, at step 312 following the addition operation. As yet another example, when the number of nonzero sub-matrices in a block-column is larger than D, the method can be used to handle D of these sub-matrices in each block-column, wherein the remaining sub-matrices can be handled in any suitable method.

The design method of FIG. 6 can be also implemented with the roles of block columns and block rows exchanged.

Inverse Shifting

In some embodiments, when exchanging L messages between a given CNP and a given VNP, MP module 116 shifts the L messages k positions cyclically in both right and left directions, depending on whether the messages are destined to the VNP or CNP. Given a partial cyclic shifter that supports only the shift values $\{k_i\}$, a corresponding inverse partial cyclic shifter is referred to herein as a cyclic shifter that supports only the shift values $\{L-k_i\}$ (in the same shift direction), or $\{-k_i\}$ (i.e., shifting $k_i$ positions in the opposite direction}. For the sake of brevity, an inverse partial cyclic shifter is also referred to herein as an inverse partial shifter. In an embodiment, MP module 116 comprises a set of partial shifters and another set of corresponding inverse partial shifters.

Figure 5C:
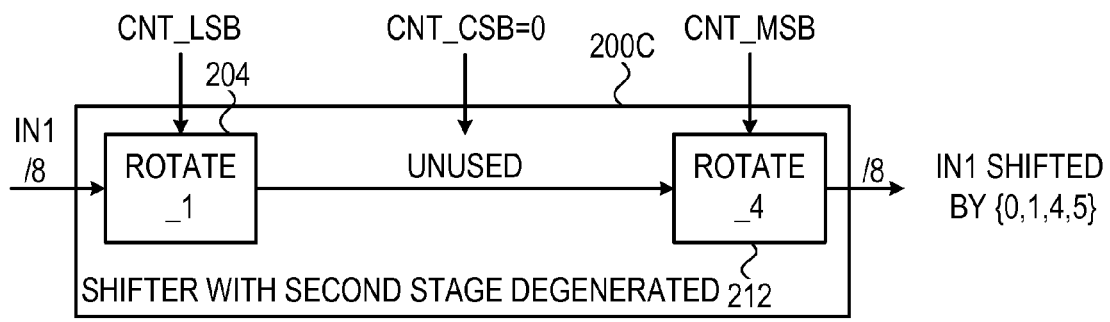
Figure 5D:
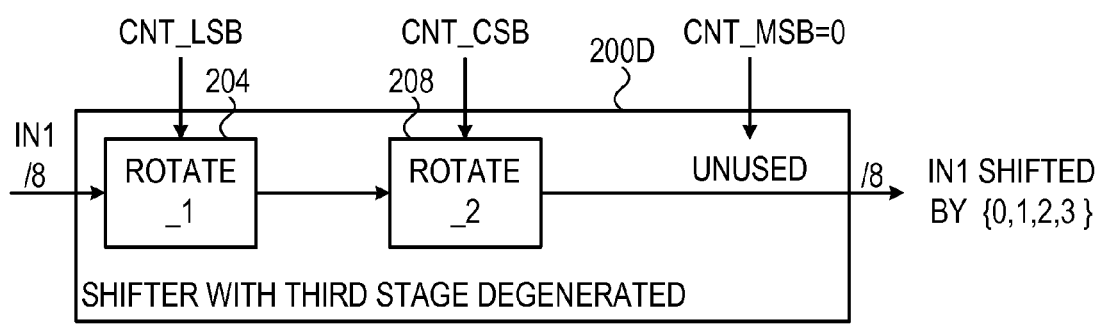

In some embodiments, a partial shifter comprises a cascade of rotation stages, for example, as described in FIGS. 5B-5D above. The corresponding inverse partial shifter comprises a similar cascade of rotation stages that are configured to shift in the opposite direction relative to the rotation stages of the partial shifter. When MP module 116 assigns a given partial shifter to shift k positions in one direction, MP module 116 assigns its inverse partial shifter to shift k positions in the opposite direction.

In another embodiment, the inverse partial shifter comprises a partial shifter whose output is shifted one additional position using suitable fixed routing. When assigning the inverse partial shifter to shift L-k positions cyclically, MP 166 assigns a respective one's complement shift value L-k-1 of k as a control shift value. A partial shifter that supports only shift values $\{k_i\}$ inherently also supports the shift values $\{L-k_i-1\}$, and therefore with an additional shift achieves the inverse shift values $\{L-k_i\}$. Since the additional shift is implemented by suitable wiring (i.e., without a rotation stage or other logic), the partial shifter and its corresponding inverse partial shifter have similar complexity.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A decoder, comprising:
variable-node circuitry and check-node circuitry, which are configured to exchange messages with one another in accordance with a parity check matrix that represents a respective Quasi-Cyclic (QC)-Low Density Parity Check (LDPC) Error Correcting Code (ECC) and that comprises L-by-L sub-matrices, L denoting a positive integer that defines a dimensionality of the sub-matrices, wherein the variable-node circuitry and the check-node circuitry are further configured to process the exchanged messages to decode a given code word that was encoded using the QC-LDPC ECC; and
a Message Passing (MP) module, which comprises multiple configurable partial cyclic shifters that each supports only a partial subset of shift values out of a full range of shift values 0 . . . L−1, L denoting the positive integer that defines the dimensionality of the sub-matrices, wherein the MP module is configured to schedule the variable-node circuitry and the check-node circuitry in accordance with a respective sub-matrix to exchange L messages simultaneously, by assigning a given partial cyclic shifter to shift the L messages cyclically by a shift value that is supported by the given partial cyclic shifter and depends on a structure of the respective sub-matrix.

2. The decoder according to claim 1, wherein the partial cyclic shifters support multiple partial subsets of shift values, each corresponding to a respective different subset of the full range of shift values 0 . . . L−1, wherein the sub-matrices are arranged in block-rows and block-columns, wherein each sub-matrix in a given block-column comprises a zero matrix or a matrix that is derived from an identity matrix by shifting the identity matrix cyclically a number of positions that belongs to a respective different partial subset.

3. The decoder according to claim 1, wherein each of the partial cyclic shifters comprises a cascade of rotation stages that supports less than the full range of shift values 0 . . . L−1, and not the full range.

4. The decoder according to claim 1, wherein the MP module is configured to schedule the check-node circuitry and the variable-node circuitry to exchange a group of one or more sets of L messages with one another simultaneously, and to assign different partial cyclic shifters to different sets of L messages in the group.

5. The decoder according to claim 4, wherein the MP module further comprises one or more full cyclic shifters that support the full range of shift values, and wherein the MP module is configured to assign at least one full cyclic shifter to a set of L messages in the group.

6. The decoder according to claim 1, wherein the MP module is configured to assign the given partial cyclic shifter when sending the L messages from the check-node circuitry to the variable-node circuitry, and to assign an inverse partial cyclic shifter corresponding to the given partial cyclic shifter when sending the L messages from the variable-node circuitry to the check-node circuitry.

7. The decoder according to claim 1, wherein the MP module is configured to exchange the L messages and the variable-node circuitry and the check-node circuitry are configured to process the exchanged messages in a single clock period of the decoder.

8. The decoder according to claim 1, wherein the given code word is stored in a memory device, and wherein the variable-node circuitry is configured to initialize by receiving the given code word from the memory device.

9. The method according to claim 1, wherein the given code word is received in a communication signal, and wherein the variable-node circuitry is configured to initialize with the given code word received in the communication signal.

10. A method for operating a decoder in a storage system or a communication system, the method comprising:
receiving in a decoder, which comprises variable-node circuitry and check-node circuitry, a code word that was encoded in accordance with a Quasi-Cyclic (QC)-Low Density Parity Check (LDPC) Error Correcting Code (ECC) that is represented by a parity check matrix that comprises L-by-L sub-matrices, L denoting a positive integer that defines a dimensionality of the sub-matrices; and decoding the received code word by shifting cyclically L messages, which the variable-node circuitry and the check-node circuitry exchange with one another simultaneously, by a shift value that is supported by the given partial cyclic shifter and is selected from a partial subset of shift values in a full range of shift values 0 . . . L−1, L denoting the positive integer that defines the dimensionality of the sub-matrices, depending on a structure of a respective sub-matrix, and processing the exchanged messages using the variable-node circuitry and the check-node circuitry.

11. The method according to claim 10, wherein shifting the L messages comprises applying multiple partial subsets of shift values, each corresponding to a respective different subset of the range of shift values 0 . . . L−1, wherein the sub-matrices are arranged in block-rows and block-columns, wherein each sub-matrix in a given block-column comprises a zero matrix or a matrix that is derived from an identity matrix by shifting the identity matrix cyclically a number of positions that belongs to a respective different partial subset.

12. The method according to claim 10, shifting the L messages comprises shifting the L messages using a partial cyclic shifter, which comprises a cascade of rotation stages that supports less than the full range of shift values 0 . . . L−1, and not all the full range.

13. The method according to claim 10, and comprising scheduling the variable-node circuitry and the check-node circuitry to exchange a group of one or more sets of L messages with one another simultaneously, including assigning different partial cyclic shifters to different sets of L messages in the group.

14. The decoder according to claim 13, and comprising assigning at least one full cyclic shifter that supports the full range of shift values to a set of L messages in the group.

15. The method according to claim 10, and comprising assigning a given partial cyclic shifter that supports only a partial subset of the full range of shift values when sending the L messages from the check-node circuitry to the variable-node circuitry, and assigning an inverse partial cyclic shifter corresponding to the given partial cyclic shifter when sending the L messages from the variable-node circuitry to the check-node circuitry.

16. The method according to claim 10, wherein shifting the L messages and processing the exchanged messages is done in a single clock period of the decoder.

17. The method according to claim 10, wherein receiving the given code word comprises retrieving the code word from a memory device, and initializing the variable-node circuitry with the given code word.

18. The method according to claim 10, wherein receiving the given code word comprises receiving the code word in a communication signal, and initializing the variable-node circuitry with the code word.

* * * * *